(12) United States Patent
So

(10) Patent No.: US 9,276,048 B2
(45) Date of Patent: Mar. 1, 2016

(54) METHOD AND APPARATUS FOR INFRARED DETECTION AND DISPLAY

(71) Applicant: UNIVERSITY OF FLORIDA RESEARCH FOUNDATION, INC., Gainesville, FL (US)

(72) Inventor: Franky So, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 13/850,969

(22) Filed: Mar. 26, 2013

(65) Prior Publication Data
US 2013/0206988 A1 Aug. 15, 2013

Related U.S. Application Data

(60) Continuation of application No. 12/910,473, filed on Oct. 22, 2010, now Pat. No. 8,405,028, which is a division of application No. 11/865,505, filed on Oct. 1, 2007.

(60) Provisional application No. 60/930,225, filed on May 14, 2007, provisional application No. 60/848,581, filed on Sep. 29, 2006.

(51) Int. Cl.
*H01J 49/00* (2006.01)
*H01L 27/32* (2006.01)
(Continued)

(52) U.S. Cl.
CPC .......... *H01L 27/3227* (2013.01); *H01L 27/288* (2013.01); *H01L 27/307* (2013.01);
(Continued)

(58) Field of Classification Search
CPC . H01L 27/288; H01L 27/307; H01L 27/3227; H01L 27/4213; H01L 27/428; H01L 51/0053; H01L 51/0081; H01L 51/0504; H01L 51/4213; H01L 51/428; Y02E 10/549

USPC ............... 257/21, 40, 80, 103, 462, E33.077, 257/E33.054, E33.033, E51.022, E31.054, 257/E31.069; 250/330
See application file for complete search history.

(56) References Cited

U.S. PATENT DOCUMENTS 4,614,958 A * 9/1986 Mikami ............... G02B 6/4246
250/227.14
4,679,063 A * 7/1987 White ................... H01L 31/101
250/338.4

(Continued)

FOREIGN PATENT DOCUMENTS

JP  S63-088872 A  4/1988
JP  7175420  7/1995

(Continued)

OTHER PUBLICATIONS

Yase, K., et al., "Organic Light-emitting Devices with Photoresponsive Layer," Pacific Rim Conference on Lasers and Electro-Optics, Tokyo, Jul. 11-15, 2005, pp. 569-570.

(Continued)

*Primary Examiner* — Vongsavanh Sengdara
(74) *Attorney, Agent, or Firm* — Wolf, Greenfield & Sacks, P.C.

(57) ABSTRACT

Embodiments of the subject invention relate to a method and apparatus for infrared (IR) detection. Organic layers can be utilized to produce a phototransistor for the detection of IR radiation. The wavelength range of the IR detector can be modified by incorporating materials sensitive to photons of different wavelengths. Quantum dots of materials sensitive to photons of different wavelengths than the host organic material of the absorbing layer of the phototransistor can be incorporated into the absorbing layer so as to enhance the absorption of photons having wavelengths associated with the material of the quantum dots. A photoconductor structure can be used instead of a phototransistor. The photoconductor can incorporate PbSe or PbS quantum dots. The photoconductor can incorporate organic materials and part of an OLED structure. A detected IR image can be displayed to a user. Organic materials can be used to create an organic light-emitting device.

23 Claims, 8 Drawing Sheets

(51) Int. Cl.
*H01L 27/28* (2006.01)
*H01L 27/30* (2006.01)
*H01L 51/42* (2006.01)
*H01L 51/00* (2006.01)
*H01L 51/05* (2006.01)

(52) U.S. Cl.
CPC ......... *H01L51/428* (2013.01); *H01L 51/4213* (2013.01); *H01L 51/0053* (2013.01); *H01L 51/0081* (2013.01); *H01L 51/0504* (2013.01); *Y02E 10/549* (2013.01)

(56) References Cited

U.S. PATENT DOCUMENTS

| | | | |
|---|---|---|---|
| 4,778,692 A * | 10/1988 | Ishihara | H01L 21/0237 136/258 |
| 5,121,398 A | 6/1992 | Rao | |
| 5,315,129 A * | 5/1994 | Forrest | H01L 51/0504 257/184 |
| 5,389,788 A | 2/1995 | Grinberg et al. | |
| 5,710,428 A | 1/1998 | Ko | |
| 7,247,850 B2 | 7/2007 | Laou et al. | |
| 7,381,953 B1 | 6/2008 | Kaufman | |
| 8,304,728 B2 | 11/2012 | So | |
| 8,405,028 B2 | 3/2013 | So | |
| 2002/0027206 A1* | 3/2002 | Yuan | H01L 31/173 250/551 |
| 2002/0066904 A1 | 6/2002 | Yuan et al. | |
| 2002/0130248 A1* | 9/2002 | Bretschneider | G06K 19/073 250/214 R |
| 2003/0168599 A1 | 9/2003 | Liddiard | |
| 2004/0016923 A1 | 1/2004 | Yu et al. | |
| 2004/0031965 A1* | 2/2004 | Forrest | H01L 27/288 257/79 |
| 2005/0088079 A1 | 4/2005 | Daniels | |
| 2005/0088365 A1 | 4/2005 | Yamazaki et al. | |
| 2005/0236556 A1* | 10/2005 | Sargent | B82Y 10/00 250/214.1 |
| 2006/0043361 A1 | 3/2006 | Lee et al. | |
| 2006/0097247 A1 | 5/2006 | Kim et al. | |
| 2007/0029482 A1 | 2/2007 | Laou et al. | |
| 2007/0235753 A1 | 10/2007 | Debucquoy et al. | |
| 2008/0272713 A1 | 11/2008 | Kang et al. | |
| 2009/0206237 A1 | 8/2009 | Shannon et al. | |
| 2010/0181552 A1 | 7/2010 | So | |

FOREIGN PATENT DOCUMENTS

| | | |
|---|---|---|
| JP | 2001-076882 A | 3/2001 |
| JP | 2004-511911 A | 4/2004 |
| JP | 2005-522005 | 7/2005 |
| JP | 2006-066395 | 3/2006 |
| JP | 2006-128437 | 5/2006 |
| JP | 2006-518110 | 8/2006 |
| JP | 2008-016831 A | 1/2008 |
| WO | WO-03/084292 | 10/2003 |
| WO | WO-2004/073082 | 8/2004 |
| WO | WO-2005-101530 | 10/2005 |

OTHER PUBLICATIONS

Ban, D., et al., "Near-infrared to visible light optical upconversion by direct tandem integration of organic light-emitting diode and inorganic photodetector," *Applied Physics Letters*, Feb. 27, 2007, pp. 93108, vol. 90, No. 9, American Institute of Physics, Melville, NY, US.

Chikamatsu, M., et al., "Light up-conversion from near-infrared to blue using a photoresponsive organic light-emitting device," *Applied Physics Letters*, Jul. 22, 2002, pp. 769-771, vol. 81, No. 4, American Institute of Physics, Melville, NY, US.

Emagin Corporation, "OLED display for thermal imaging helmet," *Military and Aerospace Electronics Magazine*, Oct. 7, 2003, US.

Luo, H., et al., "Optical upconverter with integrated heterojunction phototransistor and light-emitting diode." *Applied Physics Letters*, Feb. 13, 2006, pp. 73501, vol. 88, No. 7, Melville, NY, US.

Office Action dated Apr. 11, 2011 in U.S. Appl. No. 11/865,505.
Office Action dated Oct. 27, 2011 in U.S. Appl. No. 11/865,505.
Canadian Office Action dated Feb. 24, 2014 in connection with Application No. 2,665,047.
Translation of Korean Office Action dated Jul. 23, 2014 in connection with Application No. 10-2009-7008875.
Translation of Korean Office Action dated Aug. 31, 2013 in connection with Application No. 10-2009-7008875.
Translation of Japanese Office Action dated Sep. 12, 2013 in connection with Application No. 2009-530671.
Translation of Korean Office Action dated Jun. 2, 2014 in connection with Application No. 10-2014-7005504.
International Search Report dated Jun. 25, 2008 in connection with Application No. PCT/US2007/080104.
International Preliminary Report on Patentability and Written Opinion dated Mar. 31, 2009 in connection with Application No. PCT/US2007/080104.
Office Action dated Feb. 3, 2012 in U.S. Appl. No. 12/910,473.
Office Action dated Aug. 8, 2012 in U.S. Appl. No. 12/910,473.
Office Action dated Feb. 17, 2012 in U.S. Appl. No. 12/910,453.
[No Author Listed] OLED Display for Thermal Imaging Helmet, Military and Aerospace Electronics. Oct. 7, 2003, Last accessed online from http://www.militaryspace.com/articles/2003/10/oled-display-for-thermal-imagin-helmut . . . on Dec. 8, 2014. 2 pages.

* cited by examiner tris-(8-hydroxyquinoline)
aluminum (Alq3)

4-4'-bis[*N*-(1-naphthyl)-*N*-
phenyl-amino]biphenyl (NPD)

copper phthalocyanine (CuPc)

perylene-3,4!8,10-tetra-carboxylic-
diimide-di~2,6-isopropy~phenyl
(PTCDI)

METHOD AND APPARATUS FOR INFRARED DETECTION AND DISPLAY

CROSS-REFERENCE TO RELATED APPLICATIONS

This application is a continuation of U.S. application Ser. No. 12/910,473, filed Oct. 22, 2010, which is a divisional of U.S. application Ser. No. 11/865,505, filed Oct. 1, 2007, which claims the benefit of U.S. application Ser. No. 60/930,225, filed May 14, 2007, and claims the benefit of U.S. application Ser. No. 60/848,581, filed Sep. 29, 2006, all of which are hereby incorporated by reference herein in their entirety, including any figures, tables, or drawings.

BACKGROUND OF INVENTION

There are many applications for detecting infrared (IR) radiation. IR can refer to radiation having wavelengths longer than visible light (>0.7 µm) up to about 14 µm, with near-IR being a subset referring to wavelengths from about 0.7 µm to about 1.0 µm. One application is the detection of IR in environments with low ambient light, which can occur, for example, at night. It can also be useful to display to a user the image of the detected IR at a wavelength visible to the user. One common device for detecting IR images and displaying the detected images to a user is night-vision goggles.

Conventional night vision goggles are complex electro-optical devices that can require very high operating voltages and cost thousands of dollars. Typical night vision goggles intensify existing light instead of relying on their own light source and are sensitive to a broad spectrum of light, from visible through infrared. A conventional lens, called the objective lens, captures ambient light, including some near-infrared light. The gathered light is then sent to an image-intensifier tube. The tube outputs a high voltage, e.g., about 5,000 volts, to the image-tube components. The image-intensifier tube has a photo cathode, which is used to convert the photons of light energy into electrons. As the electrons pass through the tube, similar electrons are released from atoms in the tube, multiplying the original number of electrons by a factor of thousands through the use of a micro channel plate (MCP) in the tube. When the electrons from the photo cathode hit the first electrode of the MCP, they are accelerated into the glass micro channels by the 5,000-V bursts being sent between the electrode pair. As electrons pass through the micro channels, they cause thousands of other electrons to be released in each channel using a process called cascaded secondary emission. These new electrons also collide with other atoms, creating a chain reaction that results in thousands of electrons leaving the channel where only a few entered. At the end of the image-intensifier tube, the electrons hit a screen coated with phosphors. These electrons maintain their position in relation to the channel they passed through, which provides a perfect image since the electrons stay in the same alignment as the original photons. The energy of the electrons causes the phosphors to reach an excited state and release photons. These phosphors create the green image on the screen that has come to characterize night vision. The green phosphor image is viewed through another lens called the ocular lens, which allows you to magnify and focus the image. The night vision device may be connected to an electronic display, such as a monitor, or the image may be viewed directly through the ocular lens.

Accordingly, there is a need for IR sensors/detectors, and IR sensor/detector-display combinations, that operate at low operating voltages and are lightweight and cost-effective to produce.

BRIEF SUMMARY

Embodiments of the subject invention relate to a method and apparatus for infrared (IR) detection. A specific embodiment utilizes organic layers to produce a phototransistor for the detection of IR radiation. The wavelength range of the IR detector can be modified by incorporating materials sensitive to photons of different wavelengths. In a specific embodiment, quantum dots of materials sensitive to photons of different wavelengths than the host organic material of the absorbing layer of the phototransistor can be incorporated into the absorbing layer so as to enhance the absorption of photons having wavelengths associated with the material of the quantum dots.

In another embodiment, a photoconductor structure can be used instead of a phototransistor. In one embodiment, the photoconductor can incorporate PbSe or PbS quantum dots. In another embodiment, the photoconductor can incorporate organic materials.

Specific embodiments also involve displaying a detected IR image to a user. In a specific embodiment, organic materials can be used to create an organic light-emitting device. Additional material that emits at different wavelengths can be added to the light-emitting layer. In a specific embodiment, quantum dots of materials associated with emission of photons of different wavelengths than the host organic material of the emission layer can be incorporated into the emission layer to enhance the output display of the organic light-emitting device to the user. In a preferred embodiment, the IR detection is accomplished with a phototransistor and the displaying of the detected IR image is accomplished with an organic light-emitting device such as an organic light-emitting diode (OLED). In a more preferred embodiment, the phototransistor and OLED are in series.

Embodiments of the subject invention pertain to a method and apparatus for night vision. In an embodiment, a night vision device can be accomplished by the deposition of layers of organic thin films. Embodiments of the subject device can operate at low operating voltages, such as 10-15 V. In addition, the cost of manufacturing specific embodiments of the subject device can be lower than the cost of manufacturing conventional night vision systems. In an embodiment of the subject night vision device an organic phototransistor can be in series with an organic light-emitting device, such as an organic light-emitting diode (OLED).

DETAILED DISCLOSURE

Embodiments of the subject invention relate to a method and apparatus for infrared (IR) detection. A specific embodiment utilizes organic layers to produce a phototransistor for the detection of IR radiation. The wavelength range of the IR detector can be modified by incorporating materials sensitive to photons of different wavelengths. In a specific embodiment, quantum dots of materials sensitive to photons of different wavelengths than the host organic material of the absorbing layer of the phototransistor can be incorporated into the absorbing layer so as to enhance the absorption of photons having wavelengths associated with the material of the quantum dots.

In another embodiment, a photoconductor structure can be used instead of a phototransistor. In one embodiment, the photoconductor can incorporate PbSe or PbS quantum dots. In another embodiment, the photoconductor can incorporate organic materials.

Specific embodiments also involve displaying a detected IR image to a user. In a specific embodiment, organic materials can be used to create an organic light-emitting device. Additional material that emits at different wavelengths can be added to the light-emitting layer. In a specific embodiment, quantum dots of materials associated with emission of photons of different wavelengths than the host organic material of the emission layer can be incorporated into the emission layer to enhance the output display of the organic light-emitting device to the user. In a preferred embodiment, the IR detection is accomplished with a phototransistor and the displaying of the detected IR image is accomplished with an organic light-emitting device such as an organic light-emitting diode (OLED). In a more preferred embodiment, the phototransistor and OLED are in series.

Embodiments of the subject invention pertain to a method and apparatus for night vision. In an embodiment, a night vision device can be accomplished by the deposition of layers of organic thin films. Embodiments of the subject device can operate at low operating voltages, such as 10-15 V. In addition, the cost of manufacturing specific embodiments of the subject device can be lower than the cost of manufacturing conventional night vision systems. In an embodiment of the subject night vision device an organic phototransistor can be in series with an organic light-emitting device, such as an organic light-emitting diode (OLED).

Figure 1:
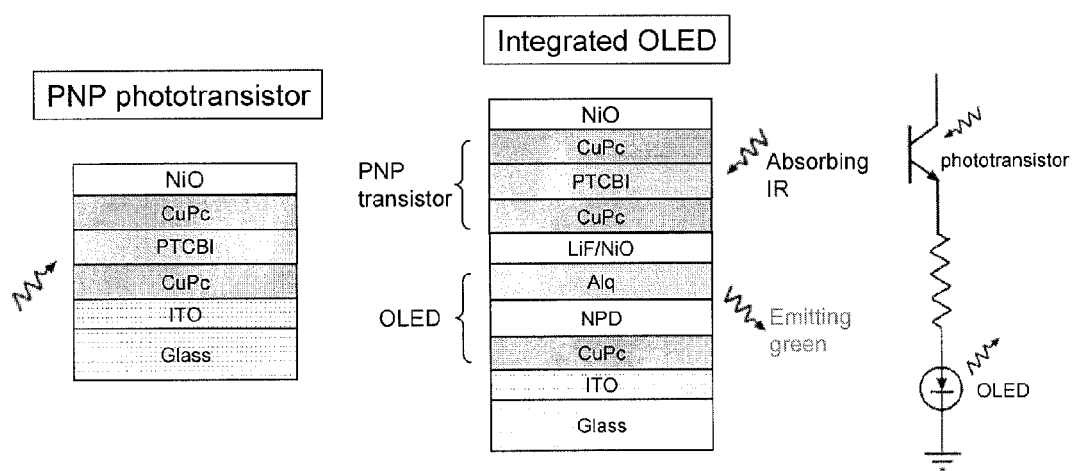
FIG. 1 shows an embodiment of a two-dimensional infrared image sensor/detector, a two-dimensional infrared image sensor/display array without pixelation, and a circuit model of the sensor/display array.

Preferably, electrodes that are transparent to infrared light are used to allow IR radiation to enter the phototransistor. A schematic diagram of an embodiment of an IR sensor/detector, an embodiment of an IR sensor-display combination, and a circuit model for the IR sensor-display combination are shown in FIG. 1. A PNP bipolar phototransistor created using layers of organic material is shown on the left of FIG. 1. Here, CuPc is the n-layer and PTCBI is the p-layer. Although the curved arrow symbolizing light (absorbing IR and emitting green) are shown pointing to the absorption layer and emission layer, respectively, the IR light enters from the top and the visible light is emitted from the bottom of the device shown in FIG. 1. In the middle of FIG. 1, the integration of the phototransistor shown on the left with an OLED is shown. IR images can be incident on the top of the electrode layer (NiO) of the phototransistor and pass through the CuPc layer and into the absorption layer (PTCBI).

Upon photoexcitation with infrared light, charge carriers are generated in the phototransistor and injected into the OLED, which then generates photons in the visible range. Because of the low conductivity of organic thin films, the electric field will be confined within the photoexcited area and visible photons will be generated within the excited area. As a result, if a broad area device is exposed to an infrared image, a visible image will be generated. Preferably, an electrode transparent to visible light is used at the bottom, where the output image is emitted. In the embodiment shown, ITO is used as an electrode, which is transparent to visible light. Other materials can also be used. A circuit diagram of the integrated device shown in the middle is shown on the right side of FIG. 1. In a specific embodiment, no electronics are required to operate the device. In an embodiment, the operating voltages of the phototransistor and the light-emitting device are less than 10 V, such that the total operating voltages can be less than 20 V. This device can be made very light weight.

In an embodiment, glass can be used as a substrate for fabrication. The entire phototransistor and OLED combination can be very thin, for example, less than 1 μm. The glass substrate with the thin layer can then be made part of night vision goggles where the thin layer is positioned to receive an IR image and a user is positioned to see the visible image emitted from the glass, or plastic, substrate such that the user receives the light emitted by the light-emitting layer as an indication of the incident IR light.

Figure 2:
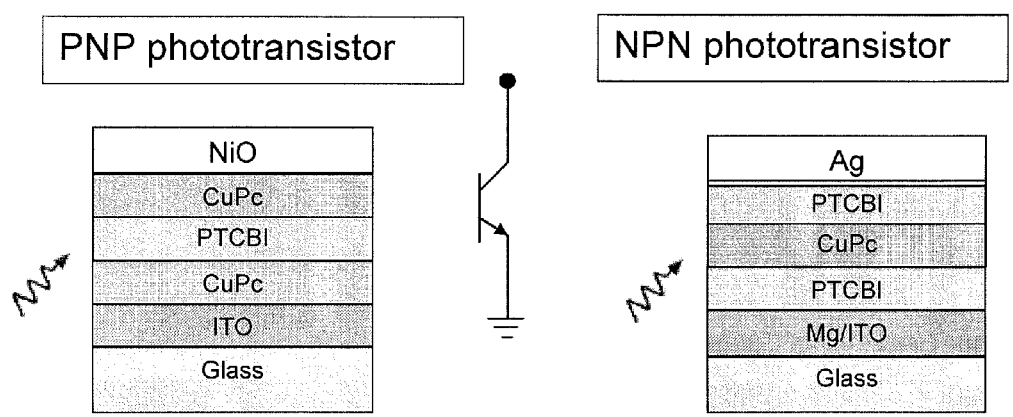
FIG. 2 shows a PNP bipolar phototransistor and an NPN bipolar phototransistor in accordance with embodiments of the subject invention.

FIG. 2 shows the PNP bipolar transistor of FIG. 1 and an NPN phototransistor, which can also be utilized in accordance with the subject invention.

The fabrication procedure for a specific embodiment of the subject IR detector-display combination will now be described. This fabrication procedure does not require any patterning. Other fabrication techniques, as well as other materials, as would be apparent to one skilled in the art having the benefit of the subject disclosure, can also be utilized in accordance with the subject invention. Devices are grown on a glass substrate or plastic substrate precoated with a 100 nm thick layer of indium-tin-oxide having a sheet resistance of 20 ohms/square. Substrates are degreased with solvents and then cleaned by exposure to oxygen plasma and UV-ozone ambient. All layers are vacuum deposited grown in succession without breaking the vacuum. In the first deposition step on top of the indium-tin-oxide (ITO) layer, to fabricate the integrated PNP phototransistor and OLED shown in the middle of FIG. 1, a 10-nm-thick CuPc is deposited as a hole injection layer. A 50 nm-thick NPD layer is then grown and acts as a hole transport layer. Next, a 60 nm-thick Alq3 emissive layer is deposited. A LiF (2 nm)/NiO (10 nm) charge generation layer is then deposited. This results in an OLED. To fabricate the phototransistor on the top of the light emitting device, a 40 nm thick CuPc layer, a 50 nm thick PTCBI layer, a 40 nm thick CuPc layer, and a 1000 nm NiO layer are then deposited.

Figure 3:
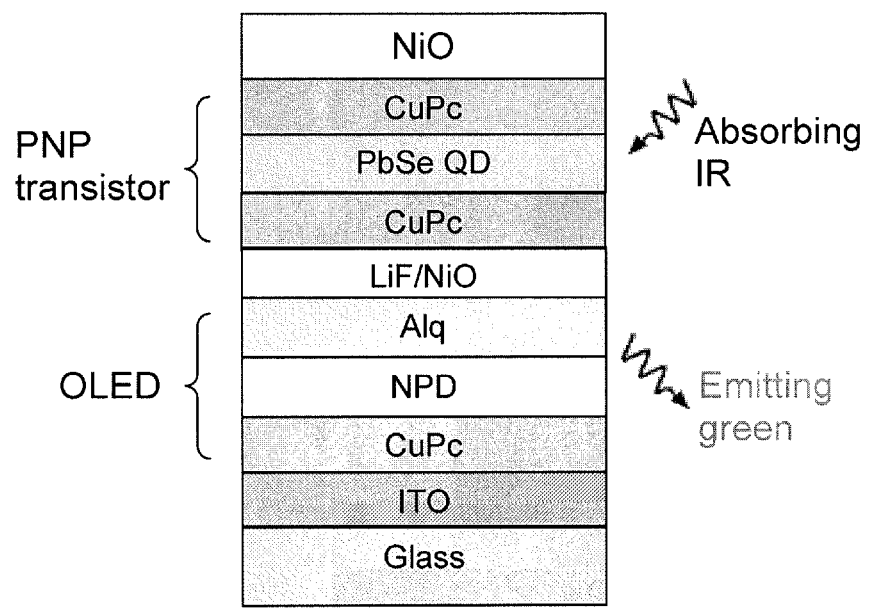
FIG. 3 shows an embodiment of an infrared image/sensor display array using PbSe quantum dots in the absorption layer.

In another specific embodiment, referring to FIG. 3, the PTCBI layer of the phototransistor is replaced with a PbS or PbSe quantum dot layer. The PbS or PbSe absorbs photons of different wavelengths than the PTCBI layer. As an example, a PTCBI layer can be created that absorbs photons up to wavelengths of about 1 μm and a PbSe quantum dot layer, or PbS quantum dot layer, can be created that also absorbs photons having wavelengths in the range of about 1 μm to about 3 μm, so as to expand to wavelength range for detection. Other wavelength ranges can be accomplished by proper selection of the material in the absorption layer.

Figure 4:
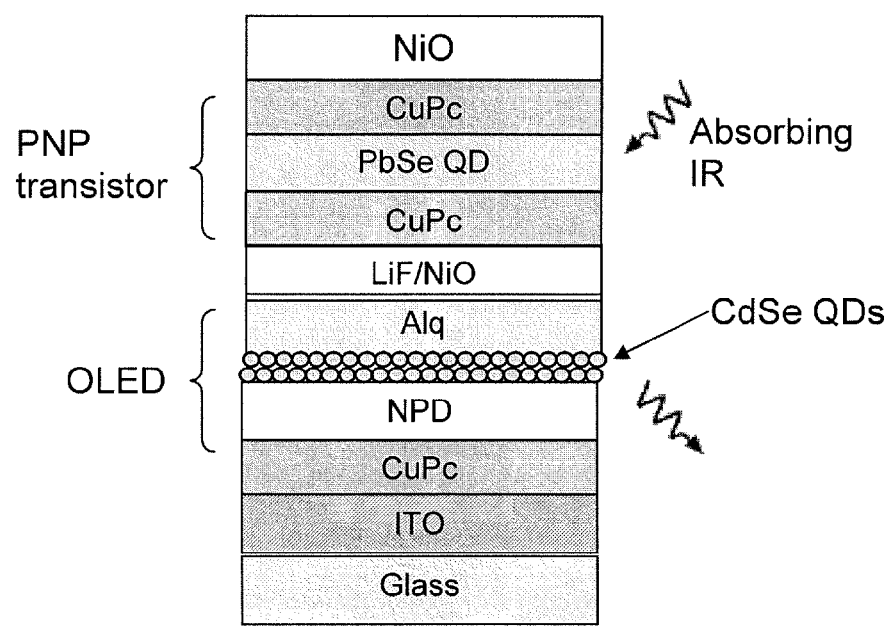
FIG. 4 shows an embodiment of the subject display device incorporating CdSe quantum dots in the emission layer.

In a further specific embodiment, referring to FIG. 4, the 60 nm Alq3 layer of the light emitting device from FIG. 1 or FIG. 3 is replaced with a 50 nm Alq3 layer and a CdSe quantum dot layer. The material for the quantum dot layer can facilitate emission of light at wavelengths different from the light emitted by the Alq3 layer. Accordingly, other materials can also be utilized in accordance with the subject invention.

Figure 5:
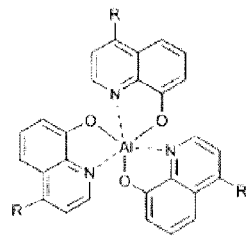
FIG. 5 shows materials that can be used in various embodiments of the subject invention.
Figure 5:
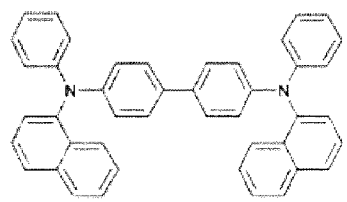
Figure 5:
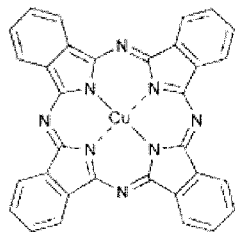
Figure 5:
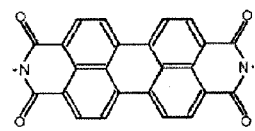

FIG. 5 shows structures of materials that can be utilized with embodiments of the subject invention. Shown in FIG. 5 are structures for tris-(8-hydroxyquinoline)aluminum (Alq3), 4-4'-bis[N-(1-naphthyl)-N-phenyl-amino]biphenyl (NPD), copper phthalocyanine (CuPc), and perylene-3,4!8,10-tetra-carboxylic-diimide-di-2,6-isopropy~phenyl (PTCDI).

Although exemplary embodiments directed to a phototransistor and phototransistor/OLED combination fabricated primarily from organic material layers have been described, additional embodiments can utilize inorganic materials for the phototransistor and/or the light emitting device. Examples of inorganic materials that can be used to fabricate phototransistors and/or light emitting device in accordance with the subject invention include, but are not limited to, amorphous silicon, germanium, and diamond-like carbon. Thin film amorphous silicon could have PbSe or PbS to absorb IR. An inorganic OLED can use ZnO to emit visible light. The use of inorganic materials in the absorption layer can allow detection of IR with wavelengths in the range of about 1 μm to 4 μm. These materials and the techniques to fabricate phototransistors and/or OLED's with structures similar to those shown in FIGS. 1, 2, 3, and 4 are known to those skilled in the art. In this way, an inorganic phototransistor can be incorporated with an organic OLED and an organic phototransistor can be incorporated with an inorganic OLED.

Figure 6:
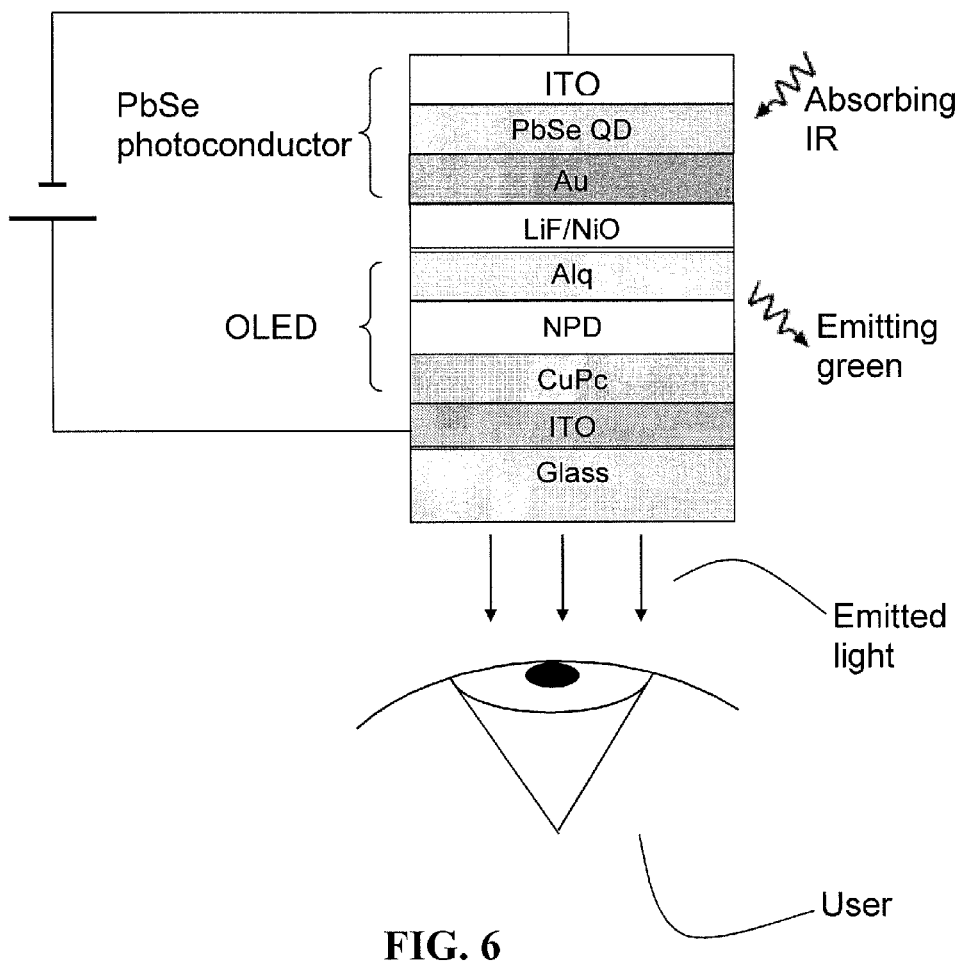
FIG. 6 shows an embodiment using PbSe quantum dots as photoconductors.

Embodiments of the present invention can incorporate a photoconductor. In specific embodiments, a photoconductor can replace the phototransistor described in the above embodiments. FIG. 6 shows a photoconductor device incorporating PbSe quantum dots. The PbSe quantum dots can be used to sense photons with wavelengths between 1 μm to 3 μm. The photoconductor structure can be formed of photoconductive material arranged between two electrodes. In one embodiment, one electrode can be formed of gold (Au) and the second electrode can be formed of ITO. In an embodiment, PbS quantum dots can be used in the place of the PbSe quantum dot layer. In operation, carriers can be photoexcited in the quantum dot (QD) layer through the absorption of IR rays. The carriers can travel to an OLED element to emit, for example, green light. In particular, electrons may be injected into an emissive layer of the OLED element and recombine with holes to give off light.

In the embodiment shown in FIG. 6, the photoconductor can be formed on an OLED element. The OLED element can be formed on a glass substrate and can incorporate an ITO layer formed on the substrate, a CuPc layer formed on the ITO layer to act as a hole transport layer, a NPD layer formed on the CuPc layer to act as a hole transport layer, an Alq layer formed on the NPD layer, and a LiF/NiO layer for charge generation formed on the Alq layer. The photoconductor can be formed on the LiF/NiO layer by depositing a gold layer on the LiF/NiO layer, forming a photoconductive material layer on the gold layer, and forming an ITO layer on the photoconductive material layer.

Figure 7:
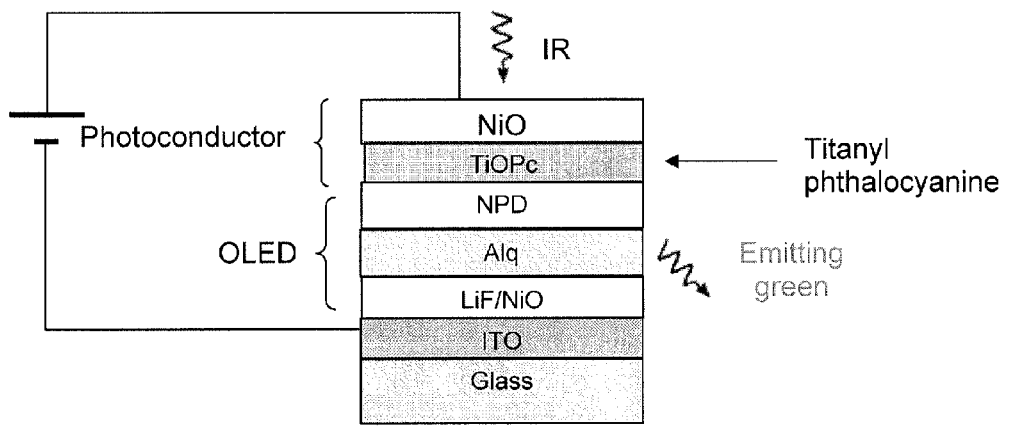
FIG. 7 shows an embodiment using organic materials as the photoconductors.

FIG. 7 shows a photoconductor device incorporating organic materials. Referring to FIG. 7, one of the electrodes for the photoconductor can be eliminated when incorporated with an OLED element. In particular, the photoconductive material can be in direct contact with a hole transporting layer of an OLED. In an embodiment, titanyl phthalocyanine (TiOPc) can be used as the photoconductive material of a photoconductor device. The TiOPc can respond to IR rays because TiOPc absorbs wavelengths at 0.8 μm. The OLED element can be formed on a glass substrate and can include an ITO layer formed on the substrate, a LiF/NiO layer formed on the ITO layer, an Alq layer formed on the LiF/NiO layer and a NPD layer formed on the Alq Layer. The photoconductive material can be formed directly on the NPD layer without an intervening electrode.

Figure 8:
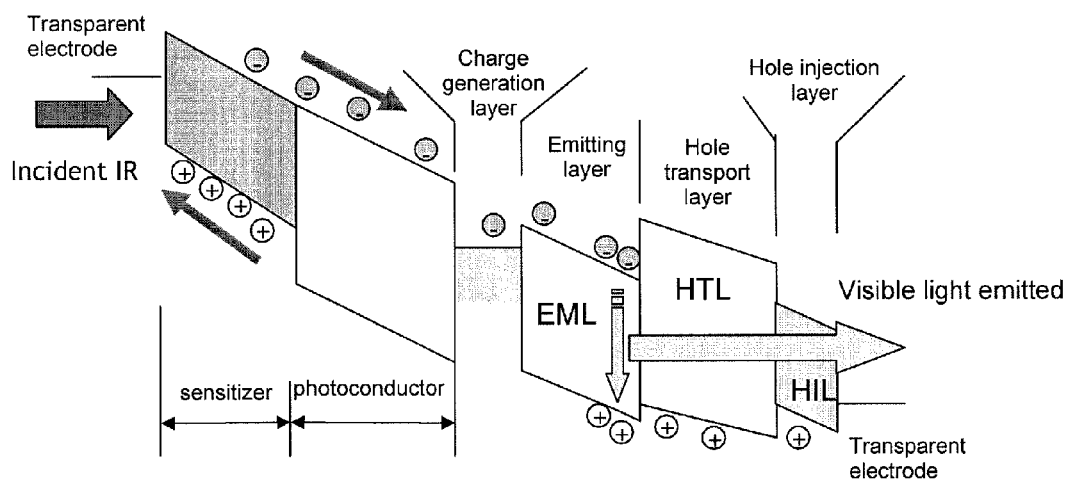
FIG. 8 shows an embodiment using a photoconductor as a light sensor.

FIG. 8 shows an embodiment incorporating a photoconductor as the light sensor. A photoconductor can have very large gain or amplification and is ideal to amplify the signal. The photoconductor device includes two layers, a charge transport layer and a sensitizer. NPD can be used as a charge transport layer and PbSe, PbS, and/or InAs quantum dots can be utilized for photon absorption.

In operation, carriers can be photoexcited in the TiOPc layer. The carriers can travel to the OLED element to emit, for example, green light. In particular, holes can be injected into the NPD layer to recombine with electrons and give off light.

In embodiments of the present invention, the gain in photoconductors can be as large as 100,000.

For embodiments incorporating photoconductors instead of phototransistors, fabrication may involve less process steps due to embodiments of photoconductors being single layer devices instead of a three-layer NPN or PNP structure.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:
1. A method of detecting infrared (IR), comprising:
providing an IR detector, wherein the IR detector comprises:
a phototransistor, wherein the phototransistor comprises an absorbing layer;
a light-emitting layer, wherein at least one of the absorbing layer and the light-emitting layer comprises an organic material;
an organic light emitting diode (OLED), wherein the OLED incorporates the light emitting layer,
a first electrode transparent to IR light; and
a second electrode,
wherein IR light to be detected passes through the first electrode transparent to IR light and enters the absorbing layer,
wherein the IR light is absorbed in the absorbing layer so as to generate photoexcited charge carriers,
wherein the charge carriers are injected into the OLED so as to generate photons,
wherein the second electrode is transparent to the generated photons,
wherein the generated photons pass through the second electrode,
wherein the generated photons are in the visible range, and
wherein the generated photons passing through the second electrode produce a visible output image corre- sponding to an IR image incident on the first electrode, incidenting IR light on the IR detector; and receiving light emitted by the light-emitting layer as an indication of the incident infrared light.

2. The method according to claim 1, wherein the phototransistor is configured to absorb light with a wavelength in a range of 700 nm to 14 µm.

3. The method according to claim 1, wherein the absorbing layer comprises the organic material and quantum dots of materials sensitive to photons of different wavelengths than the organic material of the absorbing layer.

4. The method according to claim 1, wherein the light-emitting layer comprises the organic material and quantum dots of materials associated with emission of photons of different wavelengths than the organic material of the light-emitting layer.

5. The method according to claim 1, wherein the IR detector comprises a display for displaying an output image to a user, wherein the display incorporates the OLED.

6. The method according to claim 1, wherein the phototransistor and the OLED are in series.

7. The method according to claim 6, wherein the phototransistor and the OLED form a thin layer, wherein the thin layer has a thickness less than 1 µm.

8. The method according to claim 7, wherein the thin layer is positioned on a substrate.

9. The method according to claim 1, wherein the phototransistor is a PNP bipolar transistor.

10. The method according to claim 1, wherein the phototransistor is an NPN bipolar transistor.

11. The method according to claim 1, wherein the phototransistor comprises the first electrode transparent to IR light, wherein the OLED comprises the second electrode transparent to the generated photons.

12. The method according to claim 1, wherein the absorbing layer comprises PbSe quantum dots.

13. The method according to claim 1, wherein the absorbing layer comprises PTCBI.

14. The method according to claim 13, wherein the absorbing layer is a p-layer of the phototransistor.

15. The method according to claim 14, wherein a n-layer of the phototransistor comprises CuPc.

16. The method according to claim 1, wherein the emitting layer comprises Alq3.

17. The method according to claim 1, wherein the emitting layer comprises a CdSe quantum dot layer.

18. The method according to claim 1, wherein the absorbing layer comprises PbS quantum dots.

19. The method according to claim 1, wherein the absorbing layer comprises the organic material, wherein the light-emitting layer comprises an inorganic material.

20. The method according to claim 1, wherein the light-emitting layer comprises the organic material; wherein the absorbing layer comprises an inorganic material.

21. The method according to claim 1, wherein the IR detector allows detection of wavelengths in the range of about 1 µm to about 4 µm.

22. The method according to claim 1, wherein the IR detector allows detection of wavelengths in the range of about 1 µm to about 3 µm.

23. The method according to claim 1, wherein the absorbing layer and the OLED are positioned between the first electrode and the second electrode.

* * * * *